(12) United States Patent
Yang et al.

(10) Patent No.: US 8,703,624 B2
(45) Date of Patent: Apr. 22, 2014

(54) DIELECTRIC FILMS COMPRISING SILICON AND METHODS FOR MAKING SAME

(75) Inventors: Liu Yang, Yorba Linda, CA (US); Manchao Xiao, San Diego, CA (US); Kirk Scott Cuthill, Vista, CA (US); Bing Han, Lansdale, PA (US); Mark Leonard O'Neill, San Marcos, CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 459 days.

(21) Appl. No.: 12/717,572

(22) Filed: Mar. 4, 2010

(65) Prior Publication Data

US 2010/0233886 A1 Sep. 16, 2010

Related U.S. Application Data

(60) Provisional application No. 61/159,939, filed on Mar. 13, 2009.

(51) Int. Cl.
*H01L 21/316* (2006.01)

(52) U.S. Cl.
USPC ........... 438/778; 438/789; 438/790; 438/786; 427/255.37; 257/E21.278

(58) Field of Classification Search
USPC .................. 438/758, 786, 787, 778, 789, 790
See application file for complete search history.

(56) References Cited

U.S. PATENT DOCUMENTS

| | | | |
|---|---|---|---|
| 5,204,141 A | 4/1993 | Roberts et al. | |
| 5,744,196 A | 4/1998 | Laxman et al. | |
| 7,598,178 B2 * | 10/2009 | Samoilov et al. | 438/706 |
| 2003/0032305 A1 | 2/2003 | Yau et al. | |
| 2003/0049460 A1 | 3/2003 | O'Neill et al. | |
| 2004/0166692 A1 | 8/2004 | Loboda et al. | |
| 2005/0136583 A1 * | 6/2005 | Chen et al. | 438/199 |
| 2006/0165891 A1 | 7/2006 | Edelstein et al. | |
| 2006/0178019 A1 * | 8/2006 | Senzaki et al. | 438/788 |
| 2007/0275166 A1 * | 11/2007 | Thridandam et al. | 427/248.1 |
| 2008/0102206 A1 | 5/2008 | Wagner | |

FOREIGN PATENT DOCUMENTS

| | | |
|---|---|---|
| EP | 1 148 539 A2 | 10/2001 |
| JP | 2004-312041 A | 11/2004 |
| JP | 2006-216541 A | 8/2006 |
| JP | 2006-261434 A | 9/2006 |
| WO | 2006-097525 A2 | 9/2006 |

\* cited by examiner

*Primary Examiner* — Savitr Mulpuri
(74) *Attorney, Agent, or Firm* — Rosaleen P. Morris-Oskanian; Joseph D. Rossi; Geoffrey L. Chase

(57) ABSTRACT

Described herein are methods of forming dielectric films comprising silicon, such as, but not limited to, silicon oxide, silicon oxycarbide, silicon carbide, and combinations thereof, that exhibit at least one of the following characteristics: low wet etch resistance, a dielectric constant of 6.0 or below, and/or can withstand a high temperature rapid thermal anneal process. Also disclosed herein are the methods to form dielectric films or coatings on an object to be processed, such as, for example, a semiconductor wafer.

10 Claims, 3 Drawing Sheets

DIELECTRIC FILMS COMPRISING SILICON AND METHODS FOR MAKING SAME

CROSS REFERENCE TO RELATED APPLICATION

The present patent application claims the benefit of U.S. Provisional Patent Application Ser. No. 61/159,939 filed Mar. 13, 2009.

BACKGROUND OF THE INVENTION

For high speed semiconductor devices, ultra-shallow junctions, low sheet resistance and abrupt lateral junctions are important to reduce short channel effects and to increase transistor saturation current in source drain extensions. To help form such shallow and low sheet resistance junctions, low energy implants and sharp spike anneals have been used to resolve the issues such as transient enhanced diffusion (TED), solid solubility, and channeling.

Spike anneal is typically performed by subjecting a semiconductor substrate having implanted dopants to temperature treatment in a rapid thermal processing (RTP) system. A typical annealing profile using RTP may involve ramping up to a target temperature, e.g. 1050° C., soaking the substrate at the target temperature for a period of time (which is generally referred to as "soak time"), and ramping down to a base temperature, e.g. 200° C.

As the wafers undergo the spike anneal process, the stability of the material to the annealing process, particularly for materials deposited at lower temperatures, may be critical to the device performance. More specifically, the dielectric films used for such applications should exhibit one or more of the following characteristics: relatively lower wet etch rate (such as when exposed to dilute HF); dielectric constant of 6.0 or less; good within wafer uniformity, conformality, or combinations thereof; resistance to gas phase processes (such as for example oxidative plasmas); and/or exhibits relatively little to no change in properties and film structure when subjected to a temperature spike anneal process compared to similar materials of its class.

BRIEF SUMMARY OF THE INVENTION

Described herein are methods of forming dielectric films comprising silicon, such as, but not limited to, silicon oxide, silicon oxynitride, silicon oxycarbide, and combinations thereof, that exhibit at least one of the following characteristics: relatively lower wet etch rate (such as when exposed to dilute HF); dielectric constant of 6.0 or less; good within wafer uniformity, conformality, or combinations thereof; resistance to gas phase processes (such as for example oxidative plasmas); and/or exhibits relatively little to no change in properties and film structure when subjected to a temperature spike anneal process compared to similar materials of its class. Also disclosed herein are the methods to form dielectric films or coatings on an object to be processed, such as, for example, a semiconductor wafer.

In one aspect, there is provided a method for forming a dielectric film on at least one surface of a substrate comprising: providing the at least one surface of the substrate in a reaction chamber; and forming the dielectric film on the at least one surface by a deposition process chosen from a chemical vapor deposition process and an atomic layer deposition process from an at least one silicon precursor selected from a silicon-containing precursor having the following formula I: $R^1{}_3Si-R^2-SiR^3{}_3$ wherein $R^2$ is independently selected from an alkyl group, and an aryl group and wherein $R^1$ and $R^3$ are each independently selected from H, an alkyl group, an aryl group, an alkenyl group, a halogen atom, and an alkoxy group; preferably a precursor selected from the group consisting of 1,3-disilabutane and derivatives thereof;
1,4-disilabutane and derivatives thereof;
1,4-disilylbenzene and derivatives thereof;
1,3-disilylbenzene and derivatives thereof;
1,3-disilacyclobutane and derivatives thereof;
1,4-disilacyclohexane and derivatives thereof; and combinations thereof; and an oxygen source in a molecular amount less than a 1:1 ratio to the silicon precursor.

In another aspect, there is provided a method of forming a dielectric film comprising silicon via an atomic layer deposition process, the method comprising the steps of:
  a. providing a substrate in an ALD reactor;
  b. introducing into the ALD reactor an at least one silicon precursor selected from a silicon-containing precursor having the following formula I: $R^1{}_3Si-R^2-SiR^3{}_3$ wherein $R^2$ is independently selected from an alkyl group and an aryl group and wherein $R^1$ and $R^3$ are each independently selected from H, an alkyl group, an aryl group, an alkenyl group, a halogen atom, and an alkoxy group; preferably the silicon precursor is selected from the group consisting of:
    1,3-disilabutane and derivatives thereof;
    1,4-disilabutane and derivatives thereof;
    1,4-disilylbenzene and derivatives thereof;
    1,3-disilylbenzene and derivatives thereof;
    1,3-disilacyclobutane and derivatives thereof;
    1,4-disilacyclohexane and derivatives thereof; and combinations thereof;
  c. purging the ALD reactor with a gas;
  d. introducing an oxygen source into the ALD reactor in a molecular amount less than a 1:1 ratio to the silicon precursor;
  e. purging the ALD reactor with a gas; and
  f. repeating the steps b through e until a desired thickness of the dielectric film is obtained.

In a further aspect, there is provided a method of forming a dielectric film comprising silicon oxide onto at least a surface of a substrate using a CVD process comprising:
  a. providing a substrate in a reactor;
  b. introducing into the ALD reactor an at least one silicon precursor selected from a silicon-containing precursor having the following formula I: $R^1{}_3Si-R^2-SiR^3{}_3$ wherein $R^2$ is independently selected from an alkyl group, and an aryl group and wherein $R^1$ and $R^3$ are each independently selected from H, an alkyl group, an aryl group, an alkenyl group, a halogen atom, and an alkoxy group; preferably the silicon precursor is selected from the group consisting of:
    1,3-disilabutane and derivatives thereof;
    1,4-disilabutane and derivatives thereof;
    1,4-disilylbenzene and derivatives thereof;
    1,3-disilylbenzene and derivatives thereof;
    1,3-disilacyclobutane and derivatives thereof;
    1,4-disilacyclohexane and derivatives thereof; and combinations thereof; and
  c. providing an oxygen source, in a molecular amount less than a 1:1 ratio to the silicon precursor, to deposit the dielectric film onto the at least one surface.

DETAILED DESCRIPTION OF THE INVENTION

Figure 1:
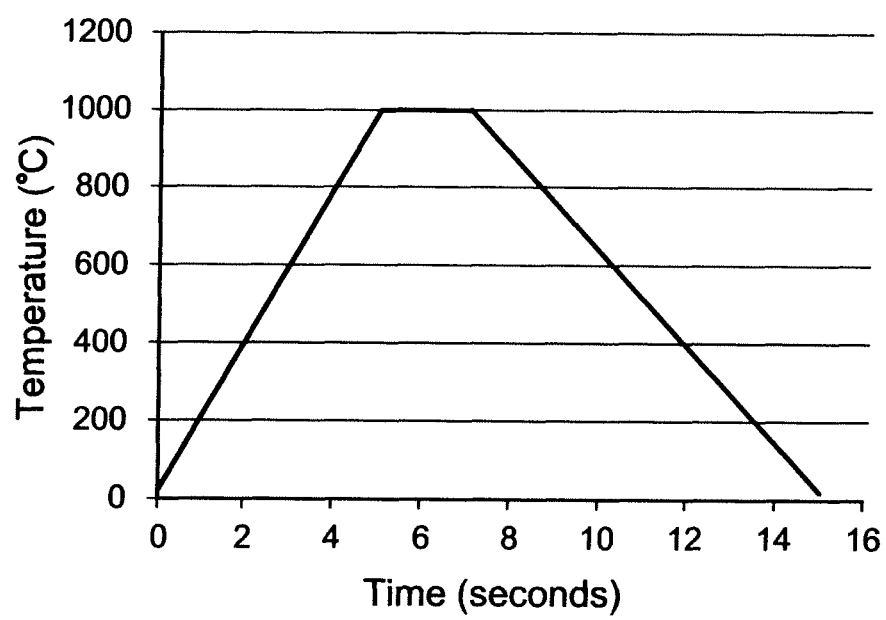
FIG. 1 provides a spike anneal profile of an exemplary dielectric film prepared by the method described herein and deposited using 1,4-disilabutane as the at least one silicon-containing precursor.

Described herein are dielectric films comprising silicon and methods for forming same that exhibit at least one of the following characteristics: relatively lower wet etch rate (such as when exposed to dilute HF); dielectric constant of 6.0 or less; good within wafer uniformity, conformality, or combinations thereof; resistance to gas phase processes (such as for example oxidative plasmas); and/or exhibits relatively little to no change in properties and film structure when subjected to a temperature spike anneal process compared to similar materials of its class. The dielectric films described herein exhibit one or more these characteristics while exhibiting 20% or less or 15% or less or 10% or less or 5% or less of the films wet etch resistance, dielectric performance, and/or film structure when comparing the same characteristics before and after a rapid thermal processing step.

Described herein are certain silicon-containing precursors, such as but not limited to, 1,4-disilabutane, 1,3-disilabutane, 1,3-disilacyclobutane, 1,4-disilacyclohexane, and 2,5-disilahexane, that deposit dielectric films that provide during high temperature spike anneal up to 1000° C. and while maintaining at least one of the aforementioned characteristics (e.g., wet etch resistance, dielectric performance, and/or film structure). These silicon-containing precursors exhibit the desired reactivity during the deposition and may provide, in certain embodiments, better control of film deposition, e.g., manageable deposition rate and film uniformity. Without wishing to be bound by theory, it is thought that films deposited using these particular silicon-containing precursors may contain appropriate levels and types of carbon in silicon oxide, silicon oxycarbide, or silicon carbide networks that may enable a significant reduction in wet etch rate yet maintaining a certain dielectric constant value and stability to a transient high temperature spike anneal.

The method used to form the dielectric films or coatings are deposition processes. Examples of suitable deposition processes for the method disclosed herein include, but are not limited to, cyclic CVD (CCVD), MOCVD (Metal Organic CVD), thermal chemical vapor deposition, plasma enhanced chemical vapor deposition ("PECVD"), high density PECVD, photon assisted CVD, plasma-photon assisted ("PPECVD"), cryogenic chemical vapor deposition, chemical assisted vapor deposition, hot-filament chemical vapor deposition, CVD of a liquid polymer precursor, deposition from supercritical fluids, and low energy CVD (LECVD). In certain embodiments, the metal containing films are deposited via plasma enhanced ALD (PEALD) or plasma enhanced cyclic CVD (PECCVD) process. As used herein, the term "chemical vapor deposition processes" refers to any process wherein a substrate is exposed to one or more volatile precursors, which react and/or decompose on the substrate surface to produce the desired deposition. As used herein, the term "atomic layer deposition process" refers to a self-limiting (e.g., the amount of film material deposited in each reaction cycle is constant), sequential surface chemistry that deposits conformal films of materials onto substrates of varying compositions. Although the precursors, reagents and sources used herein may be sometimes described as "gaseous", it is understood that the precursors can be either liquid or solid which are transported with or without an inert gas into the reactor via direct vaporization, bubbling or sublimation. In some case, the vaporized precursors can pass through a plasma generator. In one embodiment, the dielectric film is deposited using an ALD process. In another embodiment, the dielectric film is deposited using a CCVD process. In a further embodiment, the dielectric film is deposited using a thermal CVD process.

In certain embodiments, the method disclosed herein avoids pre-reaction of the precursors by using ALD or CCVD methods that separate the precursors prior to and/or during the introduction to the reactor. In this connection, deposition techniques such as an ALD or CCVD processes are used to deposit the dielectric film. In one embodiment, the film is deposited via an ALD process by exposing the substrate surface alternatively to the one or more the silicon-containing precursor, oxygen source, or other precursor or reagent. Film growth proceeds by self-limiting control of surface reaction, the pulse length of each precursor or reagent, and the deposition temperature. However, once the surface of the substrate is saturated, the film growth ceases.

As mentioned previously, the method disclosed herein forms the dielectric film using at least one silicon-containing precursor wherein the at least one silicon-containing precursor is selected from a silicon-containing precursor having the following formula I:

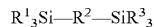
$R^1_3Si-R^2-SiR^3_3$      Formula I wherein $R^2$ is independently selected from an alkyl group, and an aryl group and wherein $R^1$ and $R^3$ are each independently selected from H, an alkyl group, an aryl group, an alkenyl group, a halogen atom and an alkoxy group; 1,3-disilabutane and derivatives thereof; preferably selected from the group consisting of 1,4-disilabutane and derivatives thereof; 1,4-disilylbenzene and derivatives thereof; 1,3-disilacyclobutane and derivatives thereof; 1,4-disilacyclohexane and derivatives thereof; optionally an additional silicon-containing precursor, an oxygen source or reagent in less than stoichiometric amount relative to the silicon of the silicon precursor, optionally a reducing agent, and optionally a nitrogen source. The selection of precursor materials for deposition depends upon the desired resultant dielectric material or film. For example, a precursor material may be chosen for its content of chemical elements, its stoichiometric ratios of the chemical elements, and/or the resultant dielectric film or coating that are formed under CVD. The precursor material may also be chosen for various other characteristics such as cost, non-toxicity, handling characteristics, ability to maintain liquid phase at room temperature, volatility, molecular weight, etc.

In one embodiment of the method disclosed herein, a dielectric films is formed using at least one silicon-containing precursor comprising the following Formula I:

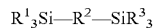
$R^1_3Si-R^2-SiR^3_3$      Formula I wherein $R^2$ is independently selected from an alkyl group, and an aryl group and wherein $R^1$ and $R^3$ are each independently selected from H, an alkyl group, an aryl group, an alkenyl group, a halogen atom and an alkoxy group.

In Formula I and throughout the description, the term "alkyl" denotes a linear, branched, or cyclic functional group having from 1 to 20, or from 1 to 12 or from 1 to 6 carbon atoms. Exemplary alkyl groups include but are not limited to methyl, ethyl, propyl, isopropyl, butyl, isobutyl, sec-butyl, tert-butyl, pentyl, hexyl, octyl, decyl, dodecyl, tetradecyl, octadecyl, isopentyl, and tert-pentyl.

In Formula I and throughout the description, the term "aryl" denotes a cyclic functional group having from 6 to 12 carbon atoms. Exemplary aryl groups include but are not limited to phenyl, benzyl, tolyl, and o-xylyl. In Formula I and throughout the description, the term "alkenyl group" denotes a group which has one or more carbon-carbon double bonds and has from 2 to 20 or from 2 to 12 or from 2 to 6 carbon atoms.

In Formula I and throughout the description, the term "alkoxy" denotes an alkyl group which has is linked to an oxygen atom (e.g., R—O) and may have from 1 to 20, or from 1 to 12, or from 1 to 6 carbon atoms. Exemplary alkoxy groups include but are not limited to methoxy (—$OCH_3$) and ethoxy group (—$OCH_2CH_3$). In certain embodiments, one or more of the alkyl group, aryl group, and/or alkoxy group may be substituted or unsubstituted or have one or more atoms or group of atoms substituted in place of a hydrogen atom. Exemplary substituents include, but are not limited to, oxygen, sulfur, halogen atoms (e.g., F, Cl, I, or Br), nitrogen, and phosphorous.

In certain embodiments, the at least one silicon-containing precursor having Formula I has an alkoxy substituent and/or one or more substituents comprising oxygen atoms. In these embodiments, the need for an oxygen source during the deposition process may be avoided. In other embodiments, the at least one silicon-containing precursor having Formula I has an alkoxy substituent and/one of more substituents comprising oxygen atoms also uses an oxygen source.

In another embodiment of the method described herein, the at least one silicon-containing precursor comprises 1,3-disilacyclobutane and derivatives thereof. The term "derivatives thereof" as used herein describes a compound that is derived from an originating compound wherein one or more hydrogen atoms, substituent groups, or both are replaced or substituted with a group that differs from the originating compound.

In a further embodiment of the method described herein, the at least one silicon-containing precursor comprises 1,4-disilacyclohexane and derivatives thereof.

In yet another embodiment of the method described herein, the at least one silicon-containing precursor comprises 1,3-disilabutane and derivatives thereof.

In a still further embodiment of the method described herein, the at least one silicon-containing precursor comprises 1,4-disilabutane and derivatives thereof.

In yet another embodiment of the method described herein, the at least one silicon-containing precursor comprises 1,4-disilylbenzene and derivatives thereof.

In yet another embodiment of the method described herein, the at least one silicon-containing precursor comprises 1,3-disilylbenzene and derivatives thereof.

In certain embodiments, the method described herein further comprises one or more additional silicon-containing precursors other than the silicon-containing precursor having the above Formula I, 1,3-disilacyclobutane and derivatives thereof, 1,4-disilacyclohexane and substituents thereof, 1,3-disilabutane and derivatives thereof; 1,4-disilabutane and derivatives thereof; 1,3-disilylbenzene and derivatives thereof; 1,4-disilylbenzene and derivatives thereof; and combinations thereof.

Examples of additional silicon-containing precursors include, but are not limited to, organo-silicon compounds such as siloxanes (e.g., hexamethyl disiloxane (HMDSO) and dimethyl siloxane (DMSO)); organosilanes (e.g., methylsilane; dimethylsilane; vinyl trimethylsilane; trimethylsilane; tetramethylsilane; ethylsilane; disilylmethane; 2,4-disilapentane; 1,4-disilabutane; 2,5-disilahexane; 2,2-disilylpropane; 1,3,5-trisilacyclohexane, and fluorinated derivatives of these compounds; phenyl-containing organo-silicon compounds (e.g., dimethylphenylsilane and diphenylmethylsilane); oxygen-containing organo-silicon compounds, e.g., dimethyldimethoxysilane; 1,3,5,7-tetramethylcyclotetrasiloxane; 1,1,3,3-tetramethyldisiloxane; 1,3,5,7-tetrasila-4-oxo-heptane; 2,4,6,8-tetrasila-3,7-dioxo-nonane; 2,2-dimethyl-2,4,6,8-tetrasila-3,7-dioxo-nonane; octamethylcyclotetrasiloxane; [1,3,5,7,9]-pentamethylcyclopentasiloxane; 1,3,5,7-tetrasila-2,6-dioxo-cyclooctane; hexamethylcyclotrisiloxane; 1,3-dimethyldisiloxane; 1,3,5,7,9-pentamethylcyclopentasiloxane; hexamethoxydisiloxane, and fluorinated derivatives of these compounds.

Depending upon the deposition method, in certain embodiments, the one or more silicon-containing precursors may be introduced into the reactor at a predetermined molar volume, or from about 0.1 to about 1000 micromoles. In this or other embodiments, the silicon-containing precursor may be introduced into the reactor for a predetermined time period, or from about 0.001 to about 500 seconds.

As previously mentioned, the dielectric films deposited using the methods described herein are formed in the presence of oxygen using an oxygen source, reagent or precursor comprising oxygen. An oxygen source may be introduced into the reactor in the form of at least one oxygen source and/or may be present incidentally in the other precursors used in the deposition process. Suitable oxygen source gases may include, for example, water ($H_2O$) (e.g., deionized water, purifier water, and/or distilled water), oxygen ($O_2$), oxygen plasma, ozone ($O_3$), NO, $NO_2$, carbon monoxide (CO), carbon dioxide ($CO_2$) and combinations thereof. In certain embodiments, the oxygen source comprises an oxygen source gas that is introduced into the reactor at a flow rate ranging from about 1 to about 2000 square cubic centimeters (sccm) or from about 1 to about 1000 sccm. The oxygen source can be introduced for a time that ranges from about 0.1 to about 100 seconds. In one particular embodiment, the oxygen source comprises water having a temperature of 10° C. or greater. In embodiments wherein the film is deposited by an ALD or a cyclic CVD process, the precursor pulse can have a pulse duration that is greater than 0.01 seconds, and the oxygen source can have a pulse duration that is less than 0.01 seconds, while the water pulse duration can have a pulse duration that is less than 0.01 seconds. In yet another embodiment, the purge duration between the pulses that can be as low as 0 seconds or is continuously pulsed without a purge in-between. The oxygen source or reagent is provided in a molecular amount less than a 1:1 ratio to the silicon precursor, so that at least some carbon is retained in the as deposited dielectric film.

The deposition methods disclosed herein may involve one or more purge gases. The purge gas, which is used to purge away unconsumed reactants and/or reaction byproducts, is an inert gas that does not react with the precursors. Exemplary inert gases include, but are not limited to, Ar, $N_2$, He, neon, $H_2$ and mixtures thereof. In certain embodiments, a purge gas such as Ar is supplied into the reactor at a flow rate ranging from about 10 to about 2000 sccm for about 0.1 to 1000 seconds, thereby purging the unreacted material and any byproduct that may remain in the reactor.

In certain embodiments of the method described herein, the temperature of the reactor or a deposition chamber may range from ambient temperature (e.g., 25° C.) to about 700° C. Exemplary reactor temperatures for the ALD or CVD deposition include ranges having any one or more of the following endpoints: 25, 50, 75, 100, 125, 150, 175, 200, 225, 250, 275, 300, 325, 350, 375, 400, 425, 450, 475, 500, 525, 550, 575, 600, 625, 650, 675, or 700° C. Examples of particular reactor temperature ranges include but are not limited to, 25° C. to 375° C., or from 75° C. to 700° C., or from 325° C. to 675° C. In this or other embodiments, the pressure may range from about 0.1 Torr to about 100 Torr or from about 0.1 Torr to about 5 Torr. In one particular embodiment, the dielectric film is deposited using a thermal CVD process at a pressure ranging from 100 mTorr to 600 mTorr. In another particular embodiment, the dielectric film is deposited using an ALD process at a temperature range of 1 Torr or less.

In certain embodiments of the method described herein, the temperature of the substrate in the reactor or a deposition chamber, may range from ambient temperature (e.g., 25° C.) to about 700° C. Exemplary substrate temperatures for the ALD or CVD deposition include ranges having any one or more of the following endpoints: 25, 50, 75, 100, 125, 150, 175, 200, 225, 250, 275, 300, 325, 350, 375, 400, 425, 450, 475, 500, 525, 550, 575, 600, 625, 650, 675, or 700° C. Examples of particular substrate temperature ranges include but are not limited to, 25° C. to 375° C., or from 75° C. to 700° C., or from 325° C. to 675° C. In certain embodiments, the substrate temperature may be the same as or in the same temperature range as the reactor temperature during the deposition. In other embodiments, the substrate temperature differs from the reactor temperature during the deposition.

The respective step of supplying the precursors, the oxygen source, and/or other precursors, source gases, and/or reagents may be performed by changing the time for supplying them to change the stoichiometric composition of the resulting dielectric film.

Energy is applied to the at least one of the precursor, oxygen source, reducing agent, other precursors or combination thereof to induce reaction and to form the dielectric film or coating on the substrate. Such energy can be provided by, but not limited to, thermal, plasma, pulsed plasma, helicon plasma, high density plasma, inductively coupled plasma, X-ray, e-beam, photon, and remote plasma methods. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively a remote plasma-generated process in which plasma is generated outside of the reactor and supplied into the reactor.

The silicon-containing precursors and/or other precursors may be delivered to the reaction chamber such as a CVD or ALD reactor in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, Minn., to enable low volatility materials to be volumetrically delivered, leading to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

In one embodiment of the method described herein, a cyclic deposition process such as CCVD, ALD, or PEALD may be employed, wherein at least one silicon-containing precursor selected from a silicon-containing precursor having Formula I, 1,3-disilacyclobutane and substituents thereof, 1,4-disilacyclohexane and substituents thereof; and combinations thereof and optionally an oxygen source such as, for example, ozone, oxygen plasma or water plasma are employed.

The gas lines connecting from the precursor canisters to the reaction chamber are heated to one or more temperatures depending upon the process requirements and the container of the silicon-containing precursor having Formula I is kept at one or more temperatures for bubbling, whereas the solution comprising the at least one silicon-containing precursor selected from a silicon-containing precursor having Formula I, 1,3-disilacyclobutane and substituents thereof, 1,4-disilacyclohexane and substituents thereof; and combinations thereof is injected into a vaporizer kept at one or more temperatures for direct liquid injection.

A flow of argon and/or other gas may be employed as a carrier gas to help deliver the vapor of the at least one silicon-containing precursor to the reaction chamber during the precursor pulsing. In certain embodiments, the reaction chamber process pressure is about 1 Torr.

In a typical ALD or CCVD process, the substrate such as a silicon oxide substrate is heated on a heater stage in a reaction chamber that is exposed to the silicon-containing precursor initially to allow the complex to chemically adsorb onto the surface of the substrate.

A purge gas such as argon purges away unabsorbed excess complex from the process chamber. After sufficient purging, an oxygen source may be introduced into reaction chamber to react with the absorbed surface followed by another gas purge to remove reaction by-products from the chamber. The process cycle can be repeated to achieve the desired film thickness.

In this or other embodiments, it is understood that the steps of the methods described herein may be performed in a variety of orders, may be performed sequentially or concurrently (e.g., during at least a portion of another step), and any combination thereof. The respective step of supplying the precursors and the oxygen source gases may be performed by varying the duration of the time for supplying them to change the stoichiometric composition of the resulting dielectric film.

In another embodiment of the method disclosed herein, the dielectric films is formed using a ALD deposition method that comprises the steps of:

a. introducing an at least one silicon precursor selected from a silicon-containing precursor having the following formula I: $R^1_3Si-R^2-SiR^3_3$, wherein $R^2$ is independently selected from an alkyl group, and an aryl group and wherein $R^1$ and $R^3$ are each independently selected from H, an alkyl group, an aryl group, an alkenyl group, group, a halogen atom and an alkoxy group, preferably selected from the group consisting of:

1,3-disilabutane and derivatives thereof;
1,4-disilabutane and derivatives thereof;
1,4-disilylbenzene and derivatives thereof;
1,3-disilylbenzene and derivatives thereof;
1,3-disilacyclobutane and derivatives thereof;
1,4-disilacyclohexane and derivatives thereof; and combinations thereof; and chemisorbing the at least one silicon precursor onto a substrate;

purging away the unreacted at least one silicon-containing precursor using a purge gas;

providing an oxygen source in a molecular amount less than a 1:1 ratio to the silicon precursor onto the heated substrate to react with the sorbed at least one silicon-containing precursor; and optionally purging away any unreacted oxygen source.

The above steps define one cycle for the method described herein; and the cycle can be repeated until the desired thickness of a dielectric film is obtained. In this or other embodiments, it is understood that the steps of the methods described herein may be performed in a variety of orders, may be performed sequentially or concurrently (e.g., during at least a portion of another step), and any combination thereof. The respective step of supplying the precursors and oxygen source may be performed by varying the duration of the time for supplying them to change the stoichiometric composition of the resulting dielectric film, although always using oxygen in less than a stoichiometric amount relative to the available silicon.

For multi-component dielectric films, other precursors such as silicon-containing precursors, nitrogen-containing precursors, reducing agents, or other reagents can be alternately introduced into the reactor chamber. In a further embodiment of the method described herein, the dielectric film is deposited using a thermal CVD process. In this embodiment, the method comprises: placing one or more substrates into a reactor which is heated to a temperature ranging from ambient temperature to about 700° C. and maintained at a pressure of 1 Torr or less; introducing at least one silicon-containing precursor an at least one silicon precursor selected from a silicon-containing precursor having the following formula I: $R^1_3Si-R^2-SiR^3_3$, wherein $R^2$ is independently selected from, an alkyl group, and an aryl group and wherein $R^1$ and $R^3$ are each independently selected from H, an alkyl group, an aryl group, an alkenyl group, a halogen atom, and an alkoxy group; preferably selected from the group consisting of:

1,3-disilabutane and derivatives thereof;
1,4-disilabutane and derivatives thereof;
1,4-disilylbenzene and derivatives thereof;
1,3-disilylbenzene and derivatives thereof;
1,3-disilacyclobutane and derivatives thereof;
1,4-disilacyclohexane and derivatives thereof; and combinations thereof; and providing an oxygen source into the reactor in a molecular amount less than a 1:1 ratio to the silicon precursor, to deposit a dielectric film onto the one or more substrates wherein the reactor is maintained at a pressure ranging from 100 mTorr to 600 mTorr during the introducing step.

In certain embodiments, the resultant dielectric films or coatings can be exposed to a post-deposition treatment such as, but not limited to, a plasma treatment, chemical treatment, ultraviolet light exposure, electron beam exposure, and/or other treatments to affect one or more properties of the film.

The dielectric films described herein have a dielectric constant of 6 or less. Preferably, the films have a dielectric constant of about 5 or below, or about 4 or below, or about 3.5 or below.

As mentioned previously, the method described herein may be used to deposit a dielectric film on at least a portion of a substrate. Examples of suitable substrates include but are not limited to, silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, organic polymers, porous organic and inorganic materials, metals such as copper and aluminum, and diffusion barrier layers such as but not limited to TiN, Ti(C)N, TaN, Ta(C)N, Ta, W, or WN. The films are compatible with a variety of subsequent processing steps such as, for example, chemical mechanical planarization (CMP) and anisotropic etching processes.

The deposited dielectric films have applications, which include, but are not limited to, computer chips, optical devices, magnetic information storages, coatings on a supporting material or substrate, microelectromechanical systems (MEMS), nanoelectromechanical systems, thin film transistor (TFT), and liquid crystal displays (LCD).

The following examples illustrate the method for preparing a dielectric film described herein and are not intended to limit it in any way.

EXAMPLES

In the following examples, unless stated otherwise, properties were obtained from sample films that were deposited onto medium resistivity (8-12 Ωcm) single crystal silicon wafer substrates.

In the following examples, thickness and optical properties such as refractive index of the dielectric films were performed on a FilmTek 2000SE ellipsometer. Spectroscopic reflection data at normal incidence (angle of incidence=0°) are used for the data fitting. The range of wavelength of the light used is between 200 nm to 900 nanometers (nm). Since the extinction coefficient (k) for $SiO_2$ is zero when the wavelength of the light is between 200 nm and 4000 nm and the dispersion of $SiO_2$ is well known, the data are only fit on the high frequency dielectric constant. The thickness and refractive index of the dielectric film can be obtained by fitting the reflection data from the film to a pre-set physical model (e.g., the Lorentz Oscillator model). The RMSE (root of mean square error) is used to determine the goodness of the fitting and the valve has to be less than 1% for the results of the measurement to be considered reliable The characterization of the chemical composition of the films is accomplished using a Physical Electronics 5000VersaProbe XPS Spectrometer, which is equipped with multichannel plate detectors (MCD) and an Al monochromatic X-ray source. The XPS data are collected using $Alk_\alpha$ X-ray excitation (25 mA and 15 kV). The low-resolution survey spectra are collected at 117 eV pass energy, 50 millisecond dwell time, and 1.0 eV/step. The high-resolution regional spectra are collected at 23.5 eV pass energy, 50 msec dwell time, 0.1 eV/step. The analysis area is 100 μm at a take-off-angle of 45°.

The quantitative elemental analyses were determined by measuring the peak areas from the high-resolution regional spectra and applying the transmission-function corrected atomic sensitivity factors. A PHI Summitt software is used for data collection and CasaXPS software is used for data analysis. The etch rate is calibrated against 203 nm $SiO_2$/Si and is approximately 120 Å/min.

The etch test is carried out at 1 wt % HF (in deionized (DI) water) solution. Exemplary dielectric films are placed in HF solution for 30 seconds, followed by rinsing in DI wafer and drying before being measured again for the loss of the material during the etch. Two comparative thermal silicon oxide films with a known and consistent etch rate, or bis(tert-butylamino)silane (BTBAS) and bis(isopropylamino)vinylmethylsilane films, were used as comparative examples and were loaded in the same cassette with the films to be characterized and etched at the same time. The films, along with the comparative silicon oxide films, are measured for their thickness at 9 different points across the film surface before and after etch using an ellipsometer and a method described above. The etch rate is then calculated as the thickness reduction divided by the time that the films are immersed into the HF solution.

Fourier Infrared Spectroscopy (FTIR) data was collected on the wafers using a Thermo Nicolet Nexus 470 system equipped with a DTGS KBR detector and KBr beam splitter. Background spectra were collected on similar medium resistivity wafers to eliminate $CO_2$ and water from the spectra. Data was obtained in the range of from 4000 to 400 cm$^{-1}$ by collecting 32 scans with a resolution of 4 cm$^{-1}$. The OMNIC software package was used to process the data. All films were baseline corrected, intensities were normalized to a film thickness of 500 nm, and peaks areas and heights of interest were determined with the OMNIC software.

The dielectric constant of each sample film was determined according to ASTM Standard D150-98. Dielectric constants, k, are calculated from a C-V curve measured with a MDC 802B-150 Mercury Probe. It consists of a probe stage that holds the sample and forms electrical contacts on the film to be measured, a Keithley 236 source meter and HP4284A LCR meter for C-V measurement. Si wafers that have relatively low electrical resistivity (sheet resistance less than 0.02 ohm-cm) are used to deposit the films for C-V measurement. Front contact mode is used to form electrical contacts to the film. Liquid metal (mercury) is pushed out through a thin tube from a reservoir to the surface of the wafer to form two electrically conductive contacts. The contact areas are calculated based on the diameter of the tube from which the mercury is pushed out. The dielectric constant is then calculated from the formula:

$k$=(the capacitance)×(the contact area)/the thickness of the film.

Spike anneal processing was performed using a RTP-610 which uses high intensity visible radiation to heat a single wafer for a short time at precisely controlled temperatures. The temperatures are monitored and controlled by a pyrometer for temperature above 900° C. The spike anneal profile used in this work is illustrated in FIG. 1, i.e., ramping from room temperature to 1000° C. at rate of 200° C./second, maintaining at 1000° C. for 2 seconds and free fall to room temperature. The annealing was performed under $N_2$ atmosphere.

Example 1

The Film Properties Before and after High Temperature Rapid Anneal

Exemplary silicon oxide dielectric films were deposited using the precursor 1,4-disilabutane onto a silicon wafer using a 100 mm tube furnace under the following deposition conditions: deposition temperature of 600° C., pressure of 250 mTorr, 1,4-disilabutane precursor flow of 12 standard cubic centimeter (sccm) and oxygen $O_2$ flow of 10 sccm.

The wet etch rate, dielectric constant and thickness of the film before and after high temperature rapid anneal are provided in Tables 1 and Table 2. As can be seen from Table 2, the exemplary films made using 1,4-disilabutane can withstand high temperature rapid anneal (or spike anneal) while maintaining its excellent wet resistance and low dielectric constant. FIG. 1 provides a spike anneal profile for an exemplary dielectric film prepared by the method described herein and deposited using 1,4-disilabutane as the at least one silicon-containing precursor. Table 2 also shows that the film thickness also experiences very little change after rapid anneal.

Figure 2:
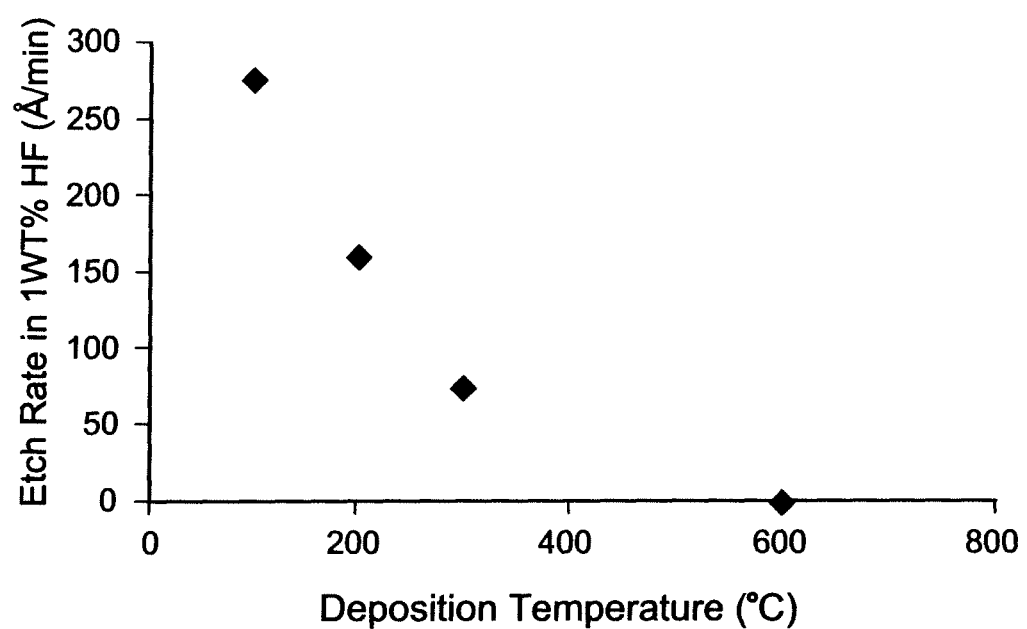
FIG. 2 provides an illustration of the effect of deposition temperature on the wet etch rate for dielectric films and deposited using 1,4-disilabutane as the at least one silicon-containing precursor.
Figure 3:
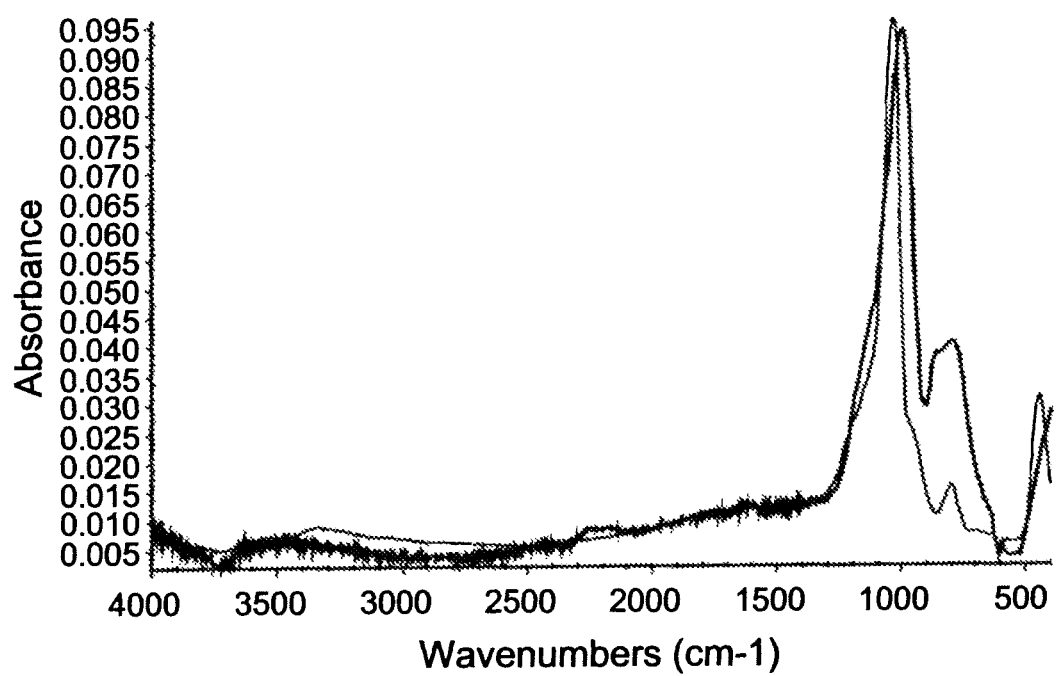
FIG. 3 provides the fourier transform spectroscopy (FTIR) spectra for an exemplary film deposited using 1,4-dilabutane and a comparative film deposited using bis(tert-butylamino) silane (BTBAS).

FIG. 2 provides an illustration of the effect of deposition temperature on the wet etch rate for dielectric films and deposited using 1,4-disilabutane as the at least one silicon-containing precursor. It can be seen from FIG. 2 that the etch resistance degrades rapidly as the deposition temperature decreases below 500° C.

TABLE 1

Wet Etch Rate (WER) and Dielectric Data for Dielectric Films Deposited Using 1,4-disilabutane

| | Wet Etch Rate (Å/min) | | | | Dielectric constant (K) | | |
|---|---|---|---|---|---|---|---|
| Ex. | No Anneal | Anneal | Change | Ex. | No Anneal | Anneal | change |
| 1 | 9.0 | | | 5 | 5.80 | | |
| 2 | 10.2 | | | 6 | 5.89 | | |
| 3 | | 3.0 | | 7 | | 4.36 | |
| 4 | | 1.0 | | 8 | | 4.90 | |

TABLE 2

Thickness And Refractive Index (RI) Before And After Spike Anneal (RTA) For Dielectric Films Deposited Using 1,4-Disilabutane

| | Thickness (Å) | | | R.I. | | |
|---|---|---|---|---|---|---|
| Example | Before | After | Change (%) | Before | After | change (%) |
| Ex. 7 | 1069 | 1051 | −1.71 | 1.689 | 1.703 | 0.83 |
| Ex. 8 | 940 | 867 | −7.77 | 1.696 | 1.694 | −0.11 |

The X-ray Photoelectron Spectroscopy (XPS) spectra of the exemplary dielectric films that have undergone spike anneal process and have not undergone spike anneal process are provided and summarized in Table 3. As can be seen from Table 3, there is no significant difference in carbon content before and after spike anneal. This may suggest that there is very little carbon loss in exemplary films deposited using 1,4-disilabutane as the at least one silicon-containing precursor due to spike anneal processing.

TABLE 3

Summary of XPS Analysis for Dielectric Films Deposited Using 1,4-Disilabutane

| Sample ID | Condition | O | C | Si |
|---|---|---|---|---|
| As-dep | As Received | 49.8 | 18.5 | 31.6 |
| | After 50 Angstrom Sputter | 52.5 | 8.4 | 39.1 |
| | After 150 Angstrom Sputter | 52.4 | 9.8 | 37.8 |
| Post-RTA* | As Received | 54.7 | 13.2 | 32.1 |
| | After 50 Angstrom Sputter | 50.3 | 10.2 | 39.5 |
| | After 150 Angstrom Sputter | 49.9 | 10.2 | 39.9 |

*Rapid Thermal Anneal

Example 2

Comparative Dielectric Films Deposited Using Bis(tert-butylamino)silane (BTBAS) and Bis(isopropylamino)vinylmethylsilane Comparative silicon oxide dielectric films were deposited using the precursors Bis(tert-butylamino)silane (BTBAS) and bis(isopropylamino)vinylmethylsilane onto a silicon wafer.

The wet etch rate, dielectric constant and thickness of the comparative dielectric films before and after high temperature rapid thermal anneal are provided in Tables 4-5 and Tables 7-8 for BTBAS and bis(isopropylamino)vinylmethylsilane, respectively. The XPS spectra of a comparative dielectric films deposited using BTBAS that have undergone spike anneal process and have not undergone spike anneal process are provided and summarized in Table 6.

TABLE 4

Wet Etch Rate and Dielectric Data for
Dielectric Films Deposited Using BTBAS

| Thickness | | | R.I.* | | |
|---|---|---|---|---|---|
| No anneal | Anneal | Change (%) | No anneal | Anneal | Change (%) |
| 1029 | 982.5 | −4.51895 | 1.51 | 1.48 | −1.98675 |

*Refractive Index

TABLE 5

Thickness and Refractive Index Before and After spike
anneal for Dielectric Films Deposited Using BTBAS

| Etch rate (Å/Min) | | | Dielectric Constant (K) | | |
|---|---|---|---|---|---|
| No anneal | Anneal | Change (%) | No anneal | Anneal | Change (%) |
| 169.5 | 70.5 | −58.4071 | 6.34 | 5.55 | −12.4606 |

TABLE 6

Summary of XPS Analysis for Dielectric
Films Deposited Using BTBAS

| Film | Location | State | O | C | Si |
|---|---|---|---|---|---|
| BTBAS (As-dep) | A | As Received | 53.8 | 12.3 | 28.9 |
| | | After 120 Å Sputter | 61.2 | ND | 36.5 |
| BTBAS (As-dep) | B | As Received | 53.5 | 11.3 | 30.5 |
| | | After 120 Å Sputter | 59.4 | 2.4 | 35.6 |

TABLE 7

Thickness and Refractive Index Before and After
spike anneal for Dielectric Films Deposited Using
Bis(isopropylamino)vinylmethylsilane

| Thickness (Å) | | | Refractive Index (R.I.) | | |
|---|---|---|---|---|---|
| Before Anneal | After Anneal | Change (%) | Before Anneal | After Anneal | Change |
| 1153 | 974 | −16 | 1.480 | 1.589 | 0.109 |
| 1056 | 960 | −9 | 1.482 | 1.54 | 0.058 |
| 1023 | 830 | −19 | 1.484 | 1.597 | 0.113 |
| 964 | 828 | −14 | 1.484 | 1.56 | 0.076 |
| 1049 | 898 | −14 | 1.482 | 1.571 | 0.089 |

TABLE 8

Wet Etch Rate and Dielectric Data for Dielectric Films Deposited
Using Bis(isopropylamino)vinylmethylsilane data

| Wet Etch Rate in 1:100 HF (Å/min) | | | | Dielectric Constant (K) | | |
|---|---|---|---|---|---|---|
| Before Anneal | After Anneal | Change | Wafer ID | Before Anneal | After Anneal | Change |
| 1.2 | | | 681-4 | 7.67 | | |
| 1.2 | | | 681-9 | 7.51 | | |
| | | 27 | 681-5 | | 7.46 | |
| | | 40.2 | 681-8 | | 7.85 | |
| 1.2 | | 33.6 | 32.4 Average | 7.59 | 7.655 | 0.065 |

Example 3

Less than a 1:1 Silicon Precursor:Oxygen Source
Molecular Ratio

Experiments were run to demonstrate the criticality of depositing the silicon precursors of the present invention in the presence of an amount of an oxygen source that is available in the reaction at less than a 1:1 ratio with the silicon precursor on a molecular basis. In Table 9, below, 2,5-Disilahexane was reacted with varying molecular ratios of oxygen at a temperature of 600° C. and at 250 milliTorr. As can be seen in Table 9, when the as-deposited films are subject to evaluation for their wet etch rate (WER), the as deposited films using oxygen at a molar ratio of silicon precursor to oxygen where oxygen is present at less than a 1:1 ratio shows remarkable reduction in wet etch rate.

TABLE 9

2,5-Disilahexane Reacted with Varying Amounts of Oxygen*

| Precursor:$O_2$ | | As Deposited | | |
|---|---|---|---|---|
| sccm[t] flow ratio | Ratio | RI[x] | Dielectric K | WER[y] (Å/min) |
| 1.1:1.0 | 1.1 | 1.4871 | 4.59 | 0 |
| 1.0:1.25 | 0.8 | 1.4726 | 4.67 | 14.4 |
| 1.0:1.8 | 0.55 | 1.4533 | 5.46 | 33 |
| 2.2:1 | 2.2 | 1.5354 | 4.64 | 1.2 |

*runs at reactor temperature of 600° C. and pressure of 250 milliTorr.
[t]standard cubic centimeters per minute.
[x]refractive index.
[y]wet etch rate These experiments were repeated with 1,4-Disilabutane under the same reactor conditions. The same dramatic reduction is wet etch rate is shown for 1,4-Disilabutane when the oxygen is present in less than a 1:1 molecular ratio in relation to the silicon precursor, as shown in Table 10, below.

TABLE 10

1,4-Disilabutane Reacted with Varying Amounts of Oxygen*

| Precursor:$O_2$ | | As Deposited | | | |
|---|---|---|---|---|---|
| sccm[t] flow ratio | Ratio | Dep Rate (Å/min) | RI[x] | Dielectric (K) | WER[y] (Å/min) |
| 1.6:1.0 | 1.6 | 74.4 | 1.7839 | 5.61 | 1.8 |
| 1.0:1.25 | 0.8 | 70.1 | 1.5303 | 4.73 | 4.2 |

*runs at reactor temperature of 600° C. and pressure of 250 milliTorr.
[t]standard cubic centimeters per minute.
[x]refractive index.
[y]wet etch rate The as-deposited films of Table 10 were subject to a rapid high temperature post deposition thermal anneal (RTA). Again, as reported in Table 11, below, the film deposited with oxygen at less than a 1:1 molecular ratio to the silicon precursor, showed a dramatic decrease in wet etch rate.

TABLE 11

1,4-Disilabutane Reacted with Varying Amounts of Oxygen*

| Precursor:$O_2$ | | Post RTA | | |
|---|---|---|---|---|
| sccm[t] flow ratio | Ratio | RI[x] | Dielectric (K) | WER[y] (Å/min) |
| 1.6:1.0 | 1.6 | 1.8606 | 5.08 | 0 |

TABLE 11-continued

| 1,4-Disilabutane Reacted with Varying Amounts of Oxygen* | | | |
|---|---|---|---|
| Precursor:O$_2$ | | Post RTA | |
| sccm$^f$ flow ratio | Ratio | RI$^x$ | Dielectric (K) | WER$^y$ (Å/min) |
| 1.0:1.25 | 0.8 | 1.5581 | 4.19 | 2.4 |

*runs at reactor temperature of 600° C. and pressure of 250 milliTorr.
$^f$standard cubic centimeters per minute.
$^x$refractive index.
$^y$wet etch rate

The invention claimed is:

1. A method for forming a dielectric film on at least one surface of a substrate, the method comprising:
   providing the at least one surface of the substrate in a reaction chamber;
   providing at least one silicon precursor selected from the group consisting of 1,4-disilabutane and derivatives thereof H;
   providing an oxygen source in a molecular amount less than a 1:1 ratio to the silicon precursor; and
   forming the dielectric film on the at least one surface by a deposition process chosen from a chemical vapor deposition process and an atomic layer deposition process, wherein the dielectric film comprises carbon and the carbon is not substantially associated with methyl substituents bonded to a silicon atom.

2. The method of claim 1 wherein the oxygen source comprises oxygen.

3. The method of claim 1 wherein the oxygen source comprises ozone.

4. The method of claim 1 wherein the dielectric film comprises silicon oxycarbide.

5. A method of forming a dielectric film comprising silicon oxide via an atomic layer deposition (ALD) process, the method comprising the steps of:
   a. providing a substrate in an ALD reactor;
   b. providing in the ALD reactor an at least one silicon precursor selected from the group consisting of 1,4-disilabutane and derivatives thereof;
   c. purging the ALD reactor with an inert gas;
   d. providing an oxygen source in the ALD reactor, in a molecular amount less than a 1:1 ratio to the silicon precursor;
   e. purging the ALD reactor with an inert gas; and
   f. repeating the steps b through e until a desired thickness of the dielectric film is obtained, wherein the dielectric film comprises carbon and the carbon is not substantially associated with methyl substituents bonded to a silicon atom.

6. A method of forming a dielectric film comprising silicon oxide onto at least a surface of a substrate using a chemical vapor deposition (CVD) process, the method comprising:
   a. providing a substrate in a CVD reactor;
   b. introducing into the CVD reactor an at least one silicon precursor selected from the group consisting of 1,4-disilabutane and derivatives thereof;
   c. providing an oxygen source into the CVD reactor, in a molecular amount less than a 1:1 ratio to the silicon precursor; and
   d. forming the silicon oxide dielectric film on the at least one surface, wherein the dielectric film comprises carbon and the carbon is not substantially associated with methyl substituents bonded to a silicon atom.

7. A dielectric film made by a method comprising the steps of:
   providing the at least one surface of the substrate in a reaction chamber;
   providing at least one silicon precursor selected from the group consisting of 1,4-disilabutane and derivatives thereof;
   providing an oxygen source in a molecular amount less than a 1:1 ratio to the silicon precursor; and
   forming the dielectric film on the at least one surface by a deposition process chosen from a chemical vapor deposition process and an atomic layer deposition process; and
   subjecting the dielectric film to a high temperature spike anneal up to 1000° C., wherein the dielectric film comprises carbon and the carbon is not substantially associated with methyl substituents bonded to a silicon atom.

8. The dielectric film of claim 7 wherein the amount of carbon in the dielectric film does not substantially change after the dielectric film is subjected to a high temperature spike anneal up to 1000° C.

9. The dielectric film of claim 7 wherein the oxygen source comprises oxygen.

10. The dielectric film of claim 7 wherein the oxygen source comprises ozone.

* * * * *